United States Patent [19]

Holmberg

[11] 4,177,475

[45] Dec. 4, 1979

[54] HIGH TEMPERATURE AMORPHOUS MEMORY DEVICE FOR AN ELECTRICALLY ALTERABLE READ-ONLY MEMORY

[75] Inventor: Scott H. Holmberg, Escondido, Calif.

[73] Assignee: Burroughs Corporation, Detroit, Mich.

[21] Appl. No.: 847,068

[22] Filed: Oct. 31, 1977

[51] Int. Cl.² .............................................. H01L 45/00
[52] U.S. Cl. .......................................... 357/2; 357/16; 357/90; 365/163
[58] Field of Search .............................. 357/2; 365/163

[56] References Cited

U.S. PATENT DOCUMENTS 3,886,577  5/1975  Buckley .................................. 357/2

*Primary Examiner*—William D. Larkins
*Attorney, Agent, or Firm*—Mervyn L. Young; Kevin R. Peterson

[57] ABSTRACT

This disclosure relates to an electrically alterable amorphous memory device which can be switched from a high resistance state to a low resistance state, which device has a stable voltage threshold that is temperature insensitive throughout the lifetime of the device. The memory device is formed of a graded structure having at least three regions or layers of amorphous material selected from the tellurium based chalcogenide class of materials, particularly tellurium-germanium systems. The center or middle region is formed of the eutectic material which is in the range of 15 to 17 percent germanium although this range may vary from 10 to 25 percent. The top region or the region closest to the positive electrode is primarily tellurium with from 0 to 10 percent germanium. The bottom region or region closest to the negative electrode is formed of a material which has the highest glassy state transition temperature which material is approximately 33 percent germanium although this may vary from 25 to 45 percent germanium.

10 Claims, 5 Drawing Figures

HIGH TEMPERATURE AMORPHOUS MEMORY DEVICE FOR AN ELECTRICALLY ALTERABLE READ-ONLY MEMORY

BACKGROUND OF THE INVENTION

1. Field of the Invention

This invention relates to an amorphous memory device for an electrically alterable read-only memory and, more particularly, to such a device which has a stable threshold voltage over a long lifetime and for a large temperature range.

2. Description of the Prior Art

Memory cells for electrically alterable read-only memories and other non-volatile memories can be formed from amorphous semiconductor devices which are capable of being switched to and from a low-resistance crystalline state. A particular type of memory switching amorphous semiconductor material is the tellurium based chalcogenide class materials which have the general formula $Ge_A Te_B X_C Y_D$. Such amorphous high-resistance semiconductor materials can be placed between a pair of spaced apart electrodes. By applying a voltage pulse (between the electrodes) of greater amplitude than the threshold voltage of the amorphous material, a low-resistance filament is formed between the electrodes. If this pulse is current limited and of proper duration, a conducting crystalline filament will form and then remain between the electrodes after the pulse is removed (set operation). A reset group of pulses of appropriate current and duration causes the crystalline path to return to a relatively amorphous state (reset operation).

Particular materials that may be employed are disclosed in the Ovshinsky U.S. Pat. No. 3,271,591, the Neale U.S. Pat. No. 3,600,543 and the Buckley U.S. Pat. No. 3,886,557.

Prior art designs of amorphous or ovonic memory switches have had a characteristic threshold voltage $V_T$ which is high at the first operation and in early operating life and lower thereafter ("first-fire effect") or which declines continuously throughout the life of the switch. Particularly, this decline is in response to repeated "reset" operations where the memory element is restored from its conducting condition to its high resistance condition. However, there are instances where it appears that the device lasted through $10^6$ set-reset cycles where the threshold voltage was observed to have a minimum low value (between 5 and 10 volts) and was relatively invariant to additional write cycles.

It appears that electromigration and thermal diffusion of the constituents of the memory material toward the different electrodes causes the steady decline in the threshold voltage. In the above-described materials, germanium and germanium-tellurium crystals appear to migrate to the negative electrode. Similarly, tellurium migrates to the positive electrode. This migration of material produces regions that are inactive in the switching process because their ratios of constituents are no longer appropriate. The region where the ratio of constituents is appropriate for switching is thus reduced in effective thickness and the threshold voltage becomes low, similarly to that of a much thinner layer.

The migration of material also produces concentration gradients. Diffusion then operates as a countervailing process, producing an equilibrium. Thermal gradients may also contribute to the process.

Memory structures with different types of layered structures have been proposed to approximate the regions of diffusion and migration that occur over many set-reset cycles. The above-referenced Buckley patent discloses an ovonic memory structure in which the threshold voltage decline is altered by placement of a tellurium layer between the positive electrode and the amorphous memory material layer. This alters the threshold voltage decline but does not eliminate it. A more complete solution to the problem of threshold voltage decline is disclosed in the Bluhm application Ser. No. 801,773, filed May 31, 1977, now U.S. Pat. No. 4,115,872, and assigned to the assignee of the present application. However, the structure disclosed therein has a voltage threshold which is temperature sensitive throughout the lifetime of the device. Temperature sensitive is defined to mean that the amorphous switching material crystallizes at temperatures as low as 70° C., but can remain in an amorphous or high resistance state at temperatures up to 130° C.

It is then an object of the present invention to provide an improved amorphous semiconductor device for electrically alterable read-only memories.

It is another object of the present invention to provide an amorphous memory device which has a relatively constant threshold voltage through its lifetime.

It is still a further object of the present invention to provide such an amorphous memory device which has a threshold voltage throughout its lifetime that is relatively temperature insensitive.

SUMMARY OF THE INVENTION

In order to accomplish the above objects, the present invention resides in an electrically alterable amorphous memory device, which device is formed of a graded structure having at least three regions or layers of amorphous material selected from the tellurium based chalcogenide class of materials. The center or middle region is formed of the eutectic material which is in the range of 15 to 17 percent germanium. The top region or the region closest to the positive electrode is primarily tellurium. The bottom region or region closest to the negative electrode is formed of a material which has the highest glassy state transition temperature which material is approximately 33 percent germanium.

A feature then of the present invention resides in a graded structure having at least three regions or layers of amorphous material where the center or middle region is formed of the eutectic material having 15 to 17 percent germanium although this range may vary from 10 to 25 percent. The top region or the region closest to the positive electrode is primarily tellurium with from 0 to 10 percent germanium. The bottom region or region closest to the negative electrode is formed of a material which has the highest glassy state transition temperature which material is approximately 33 percent germanium although this may vary from 25 to 45 percent germanium.

BRIEF DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

Figure 1:
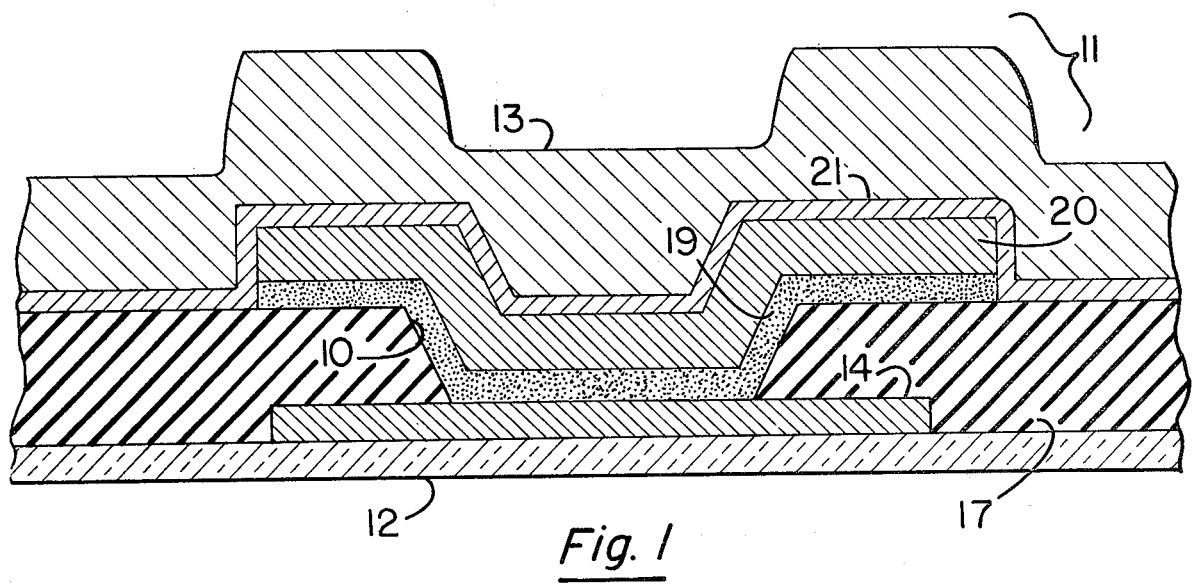
FIG. 1 is a cross-section of an amorphous memory device of the prior art.

An embodiment of prior art memory devices which uses a tellurium based chalcogenide class of materials is illustrated in FIG. 1. As shown therein the entire memory device 11 is formed on a suitable substrate 12. Device 11 would normally be employed in a memory array having vertical and horizontal conductors for random access. In FIG. 1, one of these conductors is conductor region 14 on substrate 12. Memory device 11 forms the cross-over point between a pair of orthogonal conductors 13 and 14 where conductor 13 is the positive electrode.

Conductor 14 is provided with an insulating layer 17 which may be silicon dioxide and in turn is provided with a plurality of openings 10 to initially expose the conductor material at those points where respective memory devices 11 are to be located. The amorphous semiconductor memory material 19 is then deposited by appropriate techniques over opening 10. To complete the memory device, crystalline tellurium layer 20 is sputter deposited over the memory material and a barrier-forming refractory metal layer 21 is deposited over that before the electrically conductive metal layer 13 is formed. As disclosed in the above-referenced Buckley patent, the material of layer 20 is purposely chosen to be tellurium so as to offset the tellurium migration toward the positive electrode during the set and reset cycles. The material of layer 21 is chosen to be a barrier to the migration of the material of layer 13 (e.g., Al). As was indicated above, while the tellurium tends to alter the threshold voltage decline, it does not eliminate it. In structures such as that shown in FIG. 1, the threshold voltage starts out at a relatively low value and then increases to greater than 10 volts after a relatively few set-reset cycles and this has been found to be unsatisfactory.

A typical amorphous material of the composition $Ge_{15}Te_{81}Sb_2S_2$ has a critical breakdown field of approximately $3.5 \times 10^5$ V/cm. (See for example Buckley and Holmberg, *Electrical Characteristics and Threshold Switching in Amorphous Semiconductors*, "Solid State Electronics", 1975, Vol. 18, pages 127–147). Thus, the maximum threshold voltage for such a device should be 7 volts plus an isolation diode drop of approximately 0.7 volts. It appears that thermal diffusion of germanium into the tellurium layer occurs during the reset portion of the set-reset cycle and the switching of the device is occurrin part way into the tellurium layer (plus the amorphous layer). As was indicated above, it is known that germanium can diffuse in the direction of the positive electrode because of thermal effects occurring in reset operation and that GeTe crystals electromigrate in the opposite direction towards the negative electrode. The resulting effect is to form a graded structure across the device as indicated in the above-referred to Bluhm patent application. In addition, poor storage retention of the device at high temperatures suggests that the germanium is diffusing into the tellurium layer and causing an average switching composition which is tellurium rich.

The above measurements and analysis for a prior art device of the type illustrated in FIG. 1 were for such device where the tellurium layer had a thickness greater than 0.4 micrometers and the amorphous layer was approximately 0.2 micrometers. By holding the amorphous switching material thickness constant and decreasing the tellurium thickness, a device can be achieved which has a threshold voltage less than 10 volts and exhibits a relatively constant threshold voltage throughout its lifetime while also maintaining its storage retention at high temperatures. However, such devices are difficult to reset during the first few cycles of the set-reset life since the thermal heat sinking from the top metal conductor limits the heating at the tellurium-amorphous material interface and thereby limits diffusion between the two layers. Amorphous switching materials with at least a portion thereof including approximately 23 percent germanium were found to provide for high temperature storability. The melting temperature of memory materials with such a composition is approximately 450° C. which is also approximately the melting point of tellurium and this explains the difficulty in resetting the device during the first few reset operations. When resetting a device, the filament region must be brought to at least the melting temperature of the switching material and then quenched rapidly. If the melting temperature cannot be reached, the device will not reset. The eutectic composition resets the easiest as it has the lowest melting point in the Ge-Te binary system. If diffusion does not rapidly occur between the two layers, then a eutectic composition will not form near the interface of the two chalcogenide materials until the device has been exercised a few cycles. The eutectic point for the Ge-Te binary system is approximately 15 to 17 percent germanium with the balance being tellurium.

DETAILED DESCRIPTION OF THE INVENTION

Figure 2:
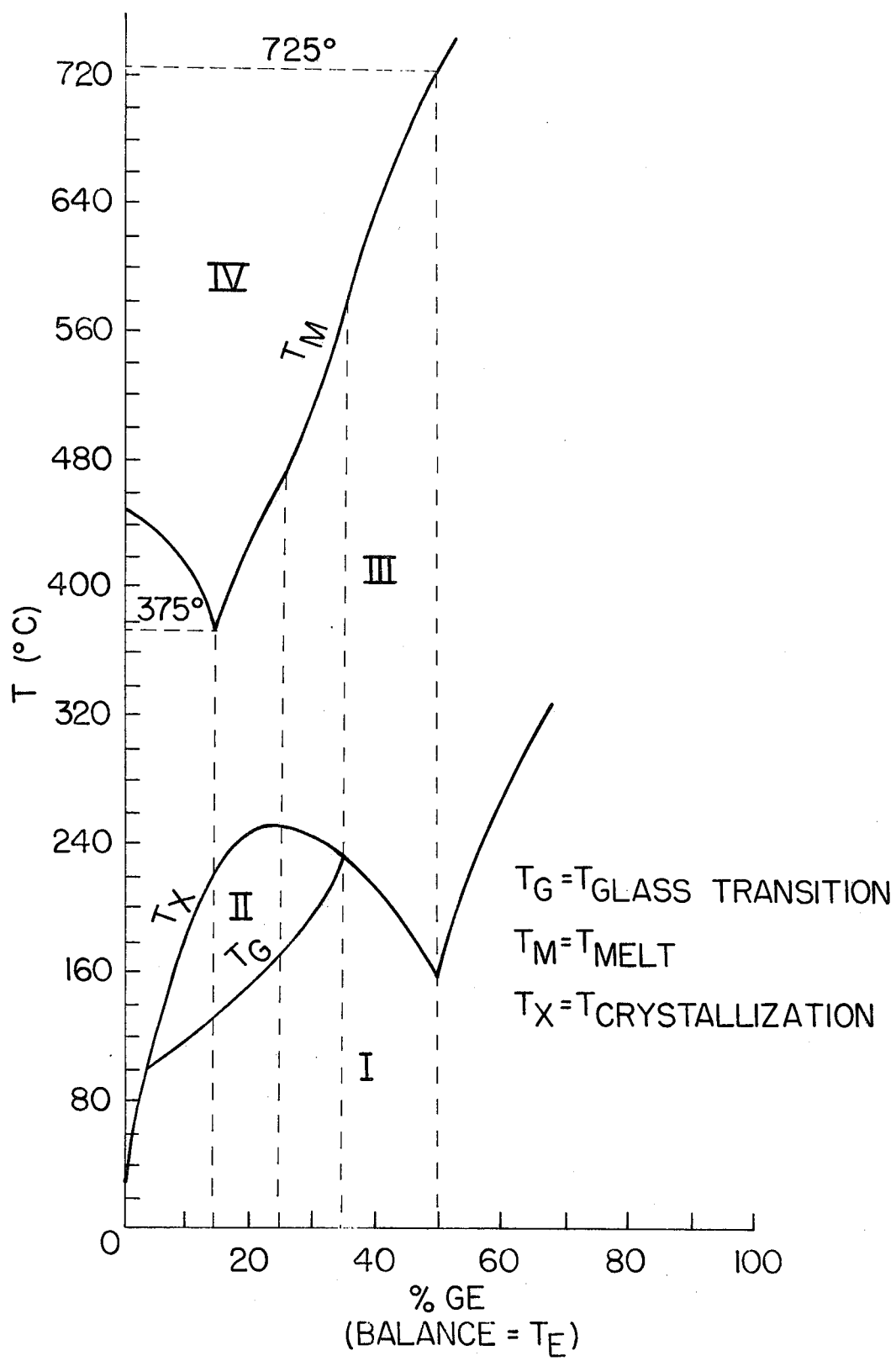
FIG. 2 is a graph of glass transition, crystallization and melting temperatures for amorphous material with different percentages of germanium.

FIG. 2 represents the various temperature characteristics of tellurium-gemanium systems as a function of percentage of germanium as published in the literature. Curve $T_M$ represents the variation in melting temperature of such systems. $T_X$ represents the temperature at which the amorphous material crystallizes as a function of the percentage germanium in the system. $T_G$ represents a glass transition that will be more thoroughly described below. These curves divide the areas of the graph of FIG. 2 into four different subareas. Area I represents those temperatures at which the amorphous system will remain in its amorphous state. Area II represents those temperatures at which the amorphous system will begin to crystallize slowly. Area III represents those temperatures at which the system will readily crystallize. Area IV represents those temperatures where the system has melted. Thus, for an amorphous memory device to have a threshold voltage which is temperature insensitive, the compositions and operating temperatures should be chosen so as to reside within Area I.

It is observed in FIG. 2 that the composition having the lowest melting temperature (the eutectic) is a tellurium-germanium system with approximately 15 to 17 percent germanium. Also, the composition having the highest glass transition temperature and therefore the most stable amorphous composition is that system with approximately 33 percent germanium, the rest being tellurium. Ge$_{33}$Te$_{66}$ is chosen as the bottom most layer so high temperature processing (up to T$_G$ and T$_X$=230° C.) can be performed during fabrication. At least one layer must remain in the amorphous state during processing or the device cannot be reset during test.

Figure 3:
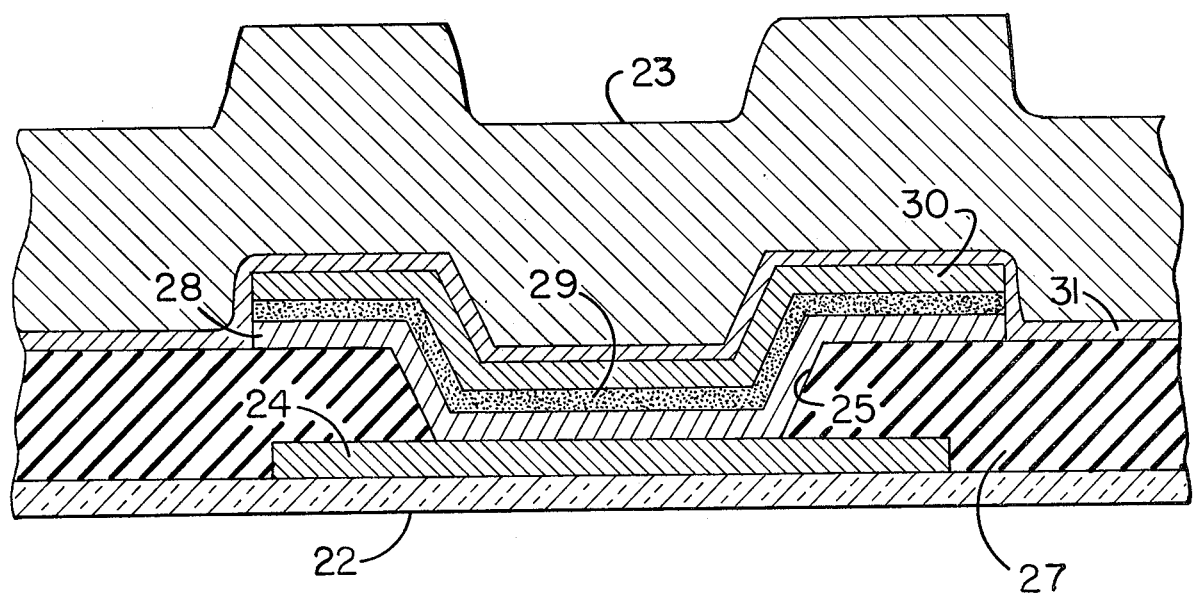
FIG. 3 is a cross-section of a memory device employing the present invention.

An embodiment of the present invention is illustrated in FIG. 3. The structure shown therein is similar to the layered structure of the above-referred to Bluhm application except for the composition changes to obtain storage retention at high temperatures, early life writability and high temperature fabrication.

In FIG. 3, the memory device is formed on a suitable insulative substrate 22 which may be a semiconductor material. Negative conductor 24 is then formed thereon out of a conductive material such as molybdenum. An insulative layer preferably of silicon dioxide is then formed thereover with an opening 25 to receive the memory device. The respective openings 25 mark the cross-over points of the orthogonal conductors which make up the memory array. Layer 28 is then deposited in opening 25 and is of a germanium-tellurium composition with proportion of approximately 33 percent germanium although this percentage may range from 25 to 45 percent. Layer 29 is then deposited over the germanium rich layer and is of an amorphous material near its eutectic with approximately 15-17 germanium although this percentage may vary from 10 to 25 percent. Layer 30 which is a tellurium rich material is then formed which layer is approximately 0 to 10 percent germanium the rest being tellurium. This layered structure is then covered with a barrier metal 31 which may be molybdenum or Ti$_{10}$W$_{90}$. The memory device thus formed is covered by a high conductive conductor 23 which may be of aluminum or gold.

Amorphous memory layer 29 will have the lowest melting temperature in the middle of the device where the highest temperatures are reached during reset operation. This is important in aiding the resetting of the device and in forming the graded structure thereof. Layer 28 is of such a composition that it may or may not contribute to the switching of the memory device and after formation will normally be crystalline and always in a conducting state. Tellurium rich layer 30 normally will be crystalline and in a conducting state after the device has been formed.

The thin germanium rich material of layer 28 and the thin tellurium rich material of layer 30 are of importance as large thermal gradients are developed across these regions. Since these layers have very small thicknesses, the device will operate in a low voltage mode where diffusion effects into these nonswitching regions are minimized. Also of importance is the fact that the average germanium-tellurium composition for all three layers should be such that the glass transition temperature of the average composition is higher than the maximum storage temperature that the device will encounter.

Figure 4A:
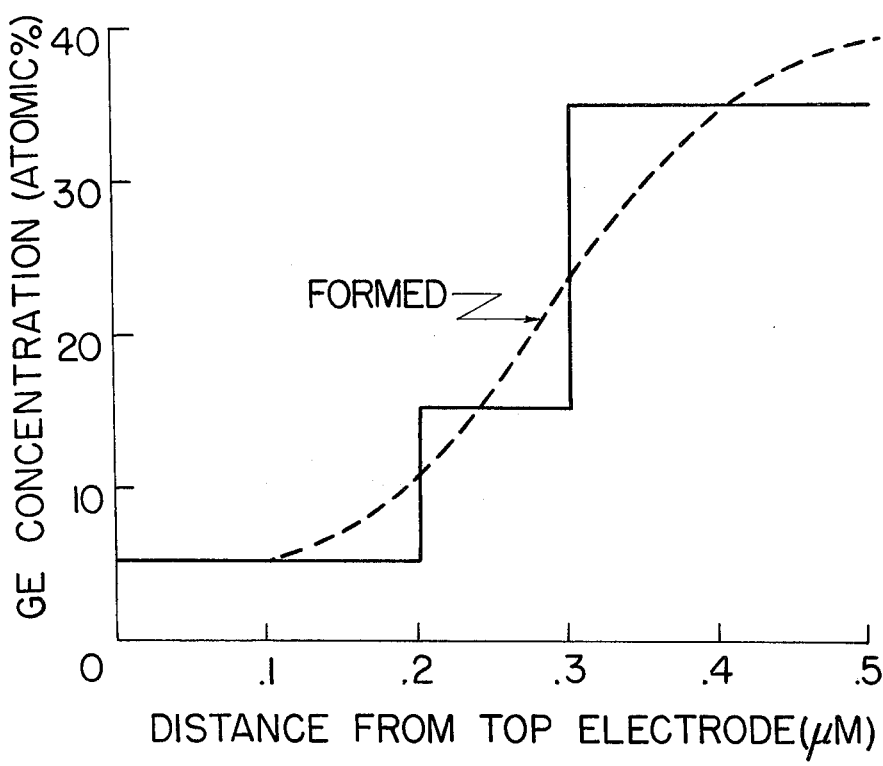
FIGS. 4A and 4B are graphs illustrating constituent concentration and melting temperature variation in a device of the present invention.
Figure 4B:
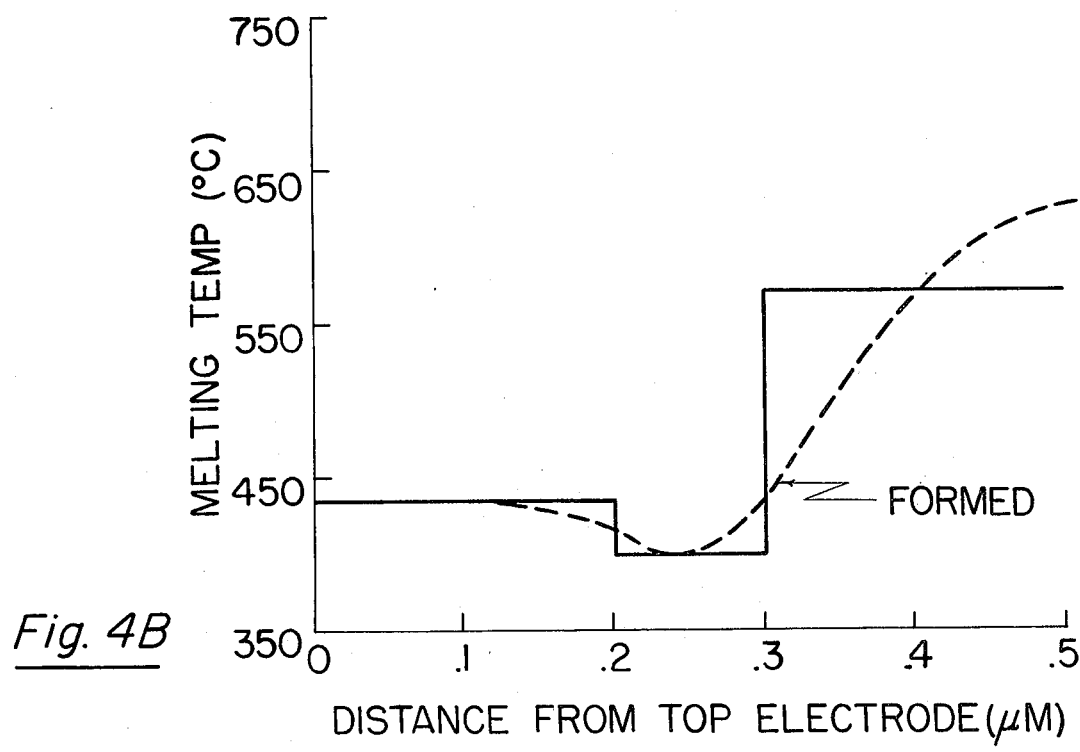

FIG. 4A represents a graph where the solid line illustrates the germanium concentration in atomic percentage as initially deposited for the structure of FIG. 3 as a function of the distance of the respective layers from the top or positive electrode. The dotted line in FIG. 4A represents the composition distribution that is formed after the device has been operated for many set-reset cycles. FIG. 4B is a graph where the solid line illustrates the melting temperature distribution in degrees centigrade of the respective compositions as initially deposited as a function of the distance thereof from the top or positive electrode. Again, the dotted line represents the melting temperature distribution formed after many set-reset cycles.

EPILOGUE

An electrically alterable amorphous memory device has been disclosed which has a voltage threshold that is relatively constant and temperature insensitive throughout the lifetime of the device. By forming the device of a graded structure having regions of different concentrations of germanium in a tellurium-germanium system, a structure is achieved which has an average glassy state transition temperature above the temperature that the device would encounter during fabrication and operation. Furthermore, the outer regions or layers allow large thermal gradients to assure that the eutectic or switching region will melt during the reset operation. The regions or layers of the graded structure are selected to approximate the gradation that would occur in such a system after many set-reset cycles therefore insuring the constant voltage threshold.

While few embodiments of the present invention have been disclosed, it will be apparent to those skilled in the art that variations and modifications may be made therein without departing from the spirit and the scope of the invention as claimed.

What is claimed is:

1. An electrically alterable memory device comprising:
   a positive electrode;
   a negative electrode; and
   a structure of memory material mounted in between said electrodes, which structure is constructed of first, second and third regions, said first region being adjacent to said positive electrode, said second region being between said first and third regions, said third region being adjacent said negative electrode and completely separating said second region from said negative electrode;
   said second region being formed of a tellurium based chacogenide which has higher electrical resistance in its amorphous state and lower electrical resistance in its crystalline state and can be switched from one state to another upon application to said electrodes of an electrical signal of appropriate value;
   said first region being formed of a material having a higher percentage of tellurium than said second region;
   said third region being formed of a material having between 25 and 45 atomic percent of germanium, the remaining material being substantially tellurium.

2. A memory device according to claim 1 wherein said third region contains approximately 33 atomic percent germanium.

3. A memory device according to claim 1 wherein said second region contains between 10 and 25 atomic percent germanium.

4. A memory device according to claim 3 wherein said second region contains between 15 and 17 atomic percent germanium.

5. A memory device according to claim 1 wherein said first region contains at least 90 atomic percent tellurium.

6. An electrically alterable memory device comprising:

a positive electrode;

a negative electrode; and a structure of memory material mounted in between said electrodes, which structure is constructed of first, second and third layers, said first layer being adjacent to said positive electrode, said second layer being between said first and third layers, said third layer being adjacent said negative electrode and completely separating said second layer from said negative electrode;

said second layer being formed of a tellurium based chalcogenide which has a higher electrical resistance in its amorphous state and lower electrical resistance in its crystalline state and can be switched from one state to another upon application to said electrodes of an electrical signal of appropriate value;

said first layer being formed of a material having a higher percentage of tellurium than said second layer;

said third layer being formed of a material having between 25 and 45 atomic percent of germanium, the remaining material being substantially tellurium.

7. A memory device according to claim 6 wherein said third layer contains approximately 33 atomic percent germanium.

8. A memory device according to claim 6 wherein said second layer contains between 10 and 25 atomic percent germanium.

9. A memory device according to claim 8 wherein said second layer contains between 15 and 17 atomic percent germanium.

10. A memory device according to claim 6 wherein said first layer contains at least 90 atomic percent tellurium.

* * * * *